(12) United States Patent
Klatchko et al.

(10) Patent No.: US 7,420,710 B2
(45) Date of Patent: Sep. 2, 2008

(54) OPTICAL PROXIMITY CORRECTION IN RASTER SCAN PRINTING BASED ON GRAYSCALE MANIPULATION OF THE BITMAP

(75) Inventors: Asher Klatchko, Portland, OR (US); Peter Y. Pirogovsky, Portland, OR (US)

(73) Assignee: Applied Materials, Inc., Santa Clara, CA (US)

( * ) Notice: Subject to any disclaimer, the term of this patent is extended or adjusted under 35 U.S.C. 154(b) by 878 days.

(21) Appl. No.: 10/870,597

(22) Filed: Jun. 16, 2004

(65) Prior Publication Data

US 2005/0036175 A1    Feb. 17, 2005

Related U.S. Application Data

(63) Continuation-in-part of application No. 09/903,843, filed on Jul. 11, 2001, now Pat. No. 7,034,963.

(51) Int. Cl.
*H04N 1/40* (2006.01)
*G06F 15/00* (2006.01)
*G06F 15/02* (2006.01)
*G06K 1/00* (2006.01)

(52) U.S. Cl. .................. 358/3.21; 358/1.2; 358/3.01; 358/3.06

(58) Field of Classification Search .............. 358/1.2, 358/3.01, 3.06, 3.21, 3.24, 3.26; 382/268, 382/269
See application file for complete search history.

(56) References Cited

U.S. PATENT DOCUMENTS

| | | | |
|---|---|---|---|
| 4,807,156 A * | 2/1989 | Parisi | ......................... 358/1.2 |
| 5,329,614 A | 7/1994 | Kidd et al. | |
| 5,363,119 A | 11/1994 | Snyder et al. | |
| 5,533,170 A | 7/1996 | Teitzel et al. | |
| 5,553,170 A | 9/1996 | Kumagai | |
| 5,563,721 A * | 10/1996 | Overton | ...................... 358/447 |
| 5,631,981 A | 5/1997 | Rao | |
| 5,751,852 A | 5/1998 | Marimont et al. | |
| 5,852,475 A * | 12/1998 | Gupta et al. | ................ 348/606 |
| 6,023,530 A | 2/2000 | Wilson | |
| 6,038,348 A | 3/2000 | Carley | |
| 6,061,476 A | 5/2000 | Nichani | |
| 6,141,460 A | 10/2000 | Amer et al. | |

OTHER PUBLICATIONS

Dana, H. Ballard and Christopher M. Brown, Computer Vision, Prentice, Hall, Inc. # Englewood Cliffs, New Jersey 07632, First Edition, 1982, pp. 76-77.

* cited by examiner

*Primary Examiner*—Edward L. Coles, Sr.
*Assistant Examiner*—James A Thompson
(74) *Attorney, Agent, or Firm*—Patterson & Sheridan, LLP

(57) ABSTRACT

Methods and apparatus for correcting defects, such as rounded corners and line end shortening, in patterns formed via photolithography are provided. Such defects are compensated for "post-rasterization" by manipulating the grayscale values of pixel maps.

18 Claims, 9 Drawing Sheets

450

UNMODIFIED GRAYSCALE VALUES

| 0 | 0 | 0 | 0 | 0 | 0 | 0 | 0 | 0 | 0 | 0 | 0 | 0 | 0 | 0 | 0 | 0 | 0 |
|---|---|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 | 0 | 0 |
| 0 | 0 | 2 | 3 | 3 | 3 | 3 | 3 | 3 | 3 | 3 | 3 | 3 | 2 | 0 | 0 | 0 | 0 |
| 0 | 0 | 14 | 16 | 16 | 16 | 16 | 16 | 16 | 16 | 16 | 16 | 16 | 14 | 0 | 0 | 0 | 0 |
| 0 | 0 | 14 | 16 | 16 | 16 | 16 | 16 | 16 | 16 | 16 | 16 | 16 | 14 | 0 | 452 | 0 |
| 0 | 0 | 14 | 16 | 16 | 16 | 16 | 16 | 16 | 16 | 16 | 16 | 16 | 14 | 0 | 0 | 0 | 0 |
| 0 | 0 | 14 | 16 | 16 | 16 | 16 | 16 | 16 | 16 | 16 | 16 | 16 | 14 | 0 | 0 | 0 | 0 |
| 0 | 0 | 12 | 16 | 16 | 16 | 16 | 16 | 16 | 16 | 16 | 16 | 16 | 14 | 0 | 0 | 0 | 0 |
| 0 | 0 | 4 | 4 | 4 | 4 | 4 | 4 | 6 | 16 | 16 | 16 | 16 | 14 | 0 | 0 | 0 | 0 |
| 0 | 0 | 0 | 0 | 0 | 456 | 0 | 0 | 4 | 16 | 16 | 16 | 16 | 14 | 0 | 0 | 0 | 0 |
| 0 | 0 | 0 | 0 | 0 | 0 | 0 | 0 | 4 | 16 | 16 | 16 | 16 | 14 | 0 | 0 | 0 | 0 |
| 0 | 0 | 0 | 0 | 0 | 0 | 0 | 0 | 4 | 16 | 16 | 16 | 16 | 14 | 0 | 0 | 0 | 0 |
| 0 | 0 | 0 | 0 | 0 | 0 | 0 | 0 | 4 | 16 | 16 | 16 | 16 | 14 | 0 | 0 | 0 | 0 |
| 0 | 0 | 0 | 0 | 0 | 0 | 0 | 0 | 4 | 16 | 16 | 16 | 16 | 14 | 0 | 0 | 0 | 0 |
| 0 | 0 | 0 | 0 | 0 | 0 | 0 | 0 | 4 | 16 | 16 | 16 | 16 | 14 | 0 | 0 | 0 | 0 |
| 0 | 0 | 0 | 0 | 0 | 0 | 0 | 0 | 4 | 14 | 14 | 14 | 14 | 12 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 |

UNMODIFIED GRAYSCALE VALUES
( CORRECTION FACTOR = 10 )

| 0 | 0 | 0  | 0  | 0  | 0  | 0  | 0  | 0  | 0  | 0  | 0  | 0  | 0 | 0 | 0 | 0 |
|---|---|----|----|----|----|----|----|----|----|----|----|----|---|---|---|---|
| 0 | 0 | 0  | 0  | 0  | 0  | 0  | 0  | 0  | 0  | 0  | 0  | 0  | 0 | 0 | 0 | 0 |
| 0 | 0 | 12 | 3  | 3  | 3  | 3  | 3  | 3  | 3  | 3  | 3  | 12 | 0 | 0 | 0 | 0 |
| 0 | 0 | 14 | 16 | 16 | 16 | 16 | 16 | 16 | 16 | 16 | 16 | 14 | 0 | 0 | 0 | 0 |
| 0 | 0 | 14 | 16 | 16 | 16 | 16 | 16 | 16 | 16 | 16 | 16 | 14 | 0 | 0 | 0 | 0 |
| 0 | 0 | 14 | 16 | 16 | 16 | 16 | 16 | 16 | 16 | 16 | 16 | 14 | 0 | 0 | 0 | 0 |
| 0 | 0 | 14 | 16 | 16 | 16 | 16 | 16 | 16 | 16 | 16 | 16 | 14 | 0 | 0 | 0 | 0 |
| 0 | 0 | 12 | 16 | 16 | 16 | 16 | 16 | 16 | 12 | 16 | 16 | 16 | 14 | 0 | 0 | 0 |
| 0 | 0 | 14 | 4  | 4  | 4  | 4  | 4  | 0  | 16 | 16 | 16 | 16 | 14 | 0 | 0 | 0 |
| 0 | 0 | 0  | 0  | 0  | 0  | 0  | 0  | 4  | 16 | 16 | 16 | 16 | 14 | 0 | 0 | 0 |
| 0 | 0 | 0  | 0  | 0  | 0  | 0  | 0  | 4  | 16 | 16 | 16 | 16 | 14 | 0 | 0 | 0 |
| 0 | 0 | 0  | 0  | 0  | 0  | 0  | 0  | 4  | 16 | 16 | 16 | 16 | 14 | 0 | 0 | 0 |
| 0 | 0 | 0  | 0  | 0  | 0  | 0  | 0  | 4  | 16 | 16 | 16 | 16 | 14 | 0 | 0 | 0 |
| 0 | 0 | 0  | 0  | 0  | 0  | 0  | 0  | 4  | 16 | 16 | 16 | 16 | 14 | 0 | 0 | 0 |
| 0 | 0 | 0  | 0  | 0  | 0  | 0  | 0  | 4  | 16 | 16 | 16 | 16 | 14 | 0 | 0 | 0 |
| 0 | 0 | 0  | 0  | 0  | 0  | 0  | 0  | 14 | 14 | 14 | 14 | 14 | 16 | 0 | 0 | 0 |
| 0 | 0 | 0  | 0  | 0  | 0  | 0  | 0  | 0  | 0  | 0  | 0  | 0  | 6  | 0 | 0 | 0 |
| 0 | 0 | 0  | 0  | 0  | 0  | 0  | 0  | 0  | 0  | 0  | 0  | 0  | 0  | 0 | 0 | 0 |

FIG. 7

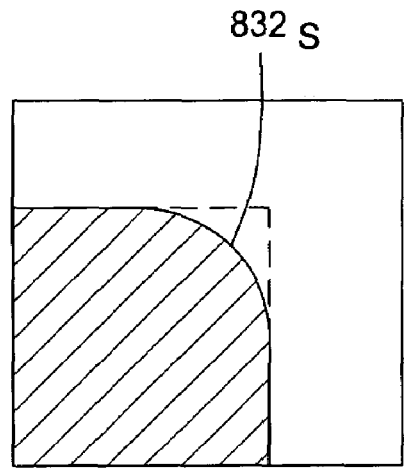
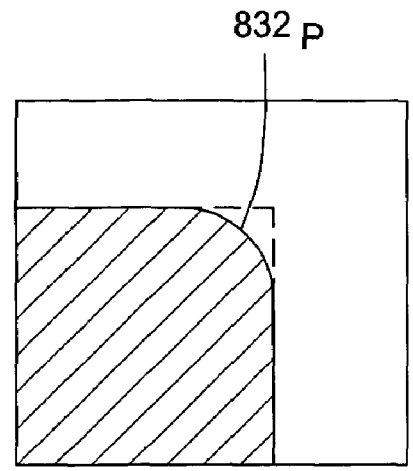
832 S
832 P
UNCORRECTED
CONVEX CORNER
CORRECTED
CONVEX CORNER
FIG. 8A
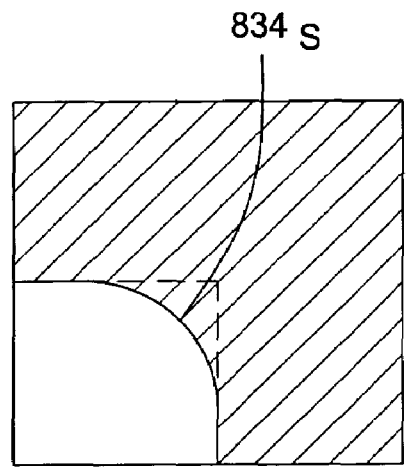
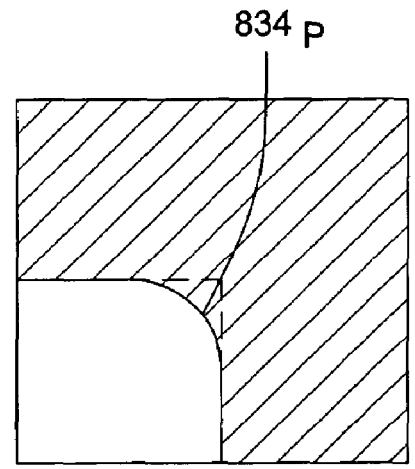
834 S
834 P
UNCORRECTED
CONCAVE CORNER
CORRECTED
CONCAVECORNER
FIG. 8B

OPTICAL PROXIMITY CORRECTION IN RASTER SCAN PRINTING BASED ON GRAYSCALE MANIPULATION OF THE BITMAP

CROSS-REFERENCE TO RELATED APPLICATIONS

This application is a continuation-in-part of U.S. patent application Ser. No. 09/903,843, filed Jul. 11, 2001 and issued as U.S. Pat. No. 7,034,963, which is herein incorporated by reference.

BACKGROUND OF THE INVENTION

1. Field of the Invention

Embodiments of the present invention generally relate to lithography systems used to print patterns or masks onto semiconductor wafers and, more particularly, to improving the acuity of pattern features printed thereby.

2. Description of the Related Art

In the photolithographic fabrication of integrated circuits, resist sensitive to radiant particle energy is exposed in predetermined patterns to define circuit features. In some cases, the energy is passed through masks which contain the patterns, thereby selectively exposing a photoresist on a semiconductor body. In other cases, the resist is on a mask substrate and the direction of the radiant energy itself is controlled to define patterns in the resist. Several sources of radiant energy have been used, including ultraviolet light, visible light, coherent light, x-rays and electron beams (E-Beams).

One system for photolithographic fabrication of integrated circuits is described in U.S. Pat. No. 4,796,038 entitled "Laser Pattern Generation Apparatus" which is assigned to the assignee of the present invention. In the system described therein, circuit patterns are written onto a workpiece by directing laser beams and moving a workpiece relative to the laser beams (e.g., while scanning the laser beams). In such systems, the intensity or dose of the laser beams at each exposed location is controlled by an array of pixels, commonly referred to as a pixel map, where the value of each pixel determines the dose at a corresponding exposed location. The dose or level of exposure is typically expressed as a grayscale value assigned to the corresponding pixel, typically zero to a maximum, where zero corresponds to a zero-dose or white, and the maximum value corresponds to a full-dose or black.

The pixel map is generated by a rasterization process in which a data file representing the pattern, such as a graphic design system (GDS) or MEBES format file, is transformed (using a component referred to as a "rasterizing engine") into the individual pixel values by determining over or on which pixels the pattern lies. The data file typically represents the image in a hierarchical format with data identifying individual vertices of the pattern features. One example of a technique and circuitry for performing such a rasterization process is described in U.S. Pat. No. 5,553,170, entitled "Rasterizer for A Pattern Generation Apparatus," which is assigned to the assignee of the present invention and incorporated herein by reference.

When writing a pattern with a lithography system, a number of boundary or edge effects, such as diffraction limited wavelength effects and electro-optical effects, for example, related to the power supplied in a radiated electron or laser beam, may result in defects in the actual written pattern. Factors in the writing process, such as sub-sampling techniques used in the rasterization process and the use of a Gaussian shaped beam for writing, may also contribute to these defects. These defects may include rounded corners and the shortening of lines due to non-sharp edges (commonly referred to as line end shortening).

One approach to compensate for rounded corners involves manipulating the data file to include additional geometries, in effect, to increase the area of exposure in proximity to the corner areas. This approach is illustrated in FIG. 1, which shows both the standard process flow 102 of rasterizing a data file $110_S$ of a pattern 111, as well as a process flow 104 including such "geometry based" optical proximity correction (OPC). As illustrated, in the standard process flow 102, the data file $110_S$ is converted to a bit map $120_S$ by a rasterization process. Due to the aforementioned boundary effects, however, writing this pattern based on the bit map $120_S$ may result in a final written pattern $130_S$ having rounded corners $132_S$ (for contrast, the ideal "sharp" corners 134 are shown as dashed lines). One metric used to quantify the rounding of corners, shown in the enlarged view of the rounded corner $132_S$ in FIG. 1A, is the distance between the tip of the ideal corner and the nearest location on the actual rounded corner, commonly referred to as corner pull back (CPB).

In the geometry-based OPC process flow 104, the data file $110_S$ is manipulated to add serifs 112 to the corners of the pattern 111, resulting in a new data file $110_G$, which is rasterized to form a new bit map $120_G$. Because of the serifs 112, this new bit map $120_G$ will have additional pixels with non-zero values located in proximity to the pattern corners. As a result, writing the pattern based on bit map $120_G$ may result in a written pattern $130_G$ with corners $132_G$ that are less rounded, having effectively been stretched outwardly toward the ideal corners 134, "regaining" corner area and, thus, reducing CPB.

Unfortunately, there are a number of disadvantages associated with this geometry-based OPC process. One disadvantage is that, due to the addition of the serifs 112, the number of corners that must be represented increases and the data file $110_G$ may grow proportionally. For example, in the simple example illustrated in FIG. 1, the original shape 111 has only four (convex) corners. However, each serif 112 adds an additional three outer (convex) corners and two inner (concave) corners to each original corner of the pattern 111. As previously described, these corners are typically expressed as vertices in the data file $110_G$, and hence these additional corners may cause the data file $110_G$ to grow by a factor of five as a result. As the data file $110_G$ grows, the amount of time required to transfer the pattern data to the rasterizer and, hence, overall processing time (time to print), may grow proportionally.

Another disadvantage associated with geometry-based OPC is that, depending on the rasterization engine, certain ideal pixel configurations that may better correct for some defects may be unachievable through the addition of simple geometries, such as serifs 112. A related disadvantage is that even if more complex geometries are added in an effort to achieve a desired pixel configuration, the data file will likely grow accordingly, thus exacerbating the previously described problems with data transfer.

Accordingly, there is a need for improved techniques for correcting defects, such as rounded corners, in patterns written by lithography. Preferably, such techniques will result in little or no impact on data transfer.

SUMMARY OF THE INVENTION

The present invention generally provides methods and systems for correcting Corners in patterns printed via lithography.

One embodiment provides a method for adjusting corners of a pattern to be written into a sensitive recording surface. The method generally includes generating a pixel map by rasterizing a data file for an image of the pattern, the pixel map comprising an array of pixels having corresponding grayscale values, detecting corner pixels in the pixel map by examining grayscale values of pixels surrounding the corner pixels, wherein corners of the pattern impinge on the corner pixels, and adjusting grayscale values of at least one of corner pixels and pixels neighboring corner pixels.

Another embodiment provides a method for adjusting corners of a pattern to be written into a sensitive recording surface. The method generally includes generating a pixel map by rasterizing a data file for an image of the pattern, the pixel map comprising an array of pixels having corresponding grayscale values, detecting convex and concave corner pixels in the pixel map by examining grayscale values of pixels surrounding the corner pixels, increasing grayscale values of at least one of convex corner pixels and pixels neighboring convex corner pixels, and decreasing grayscale values of at least one of concave corner pixels and pixels neighboring concave corner pixels.

Another embodiment provides a method for adjusting corners of a pattern to be written into a sensitive recording surface. The method generally includes generating a pixel map by rasterizing a data file for an image of the pattern, the pixel map comprising an array of pixels having corresponding grayscale values, detecting convex and concave corner pixels in the pixel map by examining grayscale values of pixels surrounding the corner pixels, increasing grayscale values of at least one of convex corner pixels and pixels neighboring convex corner pixels, and decreasing grayscale values of at least one of concave corner pixels and pixels neighboring concave corner pixels.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 4A and 4B are an exemplary pattern that may be written in accordance with embodiments of the present invention and a corresponding grayscale value pixel map, respectively.

FIG. 7 is a map of grayscale values corrected in accordance with embodiments of the present invention.

FIGS. 8A and 8B illustrate exemplary corrected convex and concave corners, respectively, in accordance with embodiments of the present invention.

DETAILED DESCRIPTION

Embodiments of the present invention generally provide methods and apparatus for correcting defects, such as rounded corners and line end shortening, in patterns formed via lithography using radiated beams, such as laser or electron beams. Rather than compensate for such defects by manipulating the pattern data file to include additional geometric objects, defects are compensated for "post-rasterization" by manipulating the grayscale values of pixel maps. As a result, the size of the data file is not increased and data transfer time may be unaffected.

Performing defect compensation after rasterization may provide a greater degree of flexibility in the exact pixel configurations achievable to manipulate (increase or decrease) dose proximate the corners. Further, as will be described herein, pixel-based defect compensation may be performed on local areas of the pattern, allowing the processing to be distributed. For example, if the defect compensation is performed in software, processing may be distributed across multiple processors acting in parallel, with each processor working on a relatively small portion of the pattern without requiring knowledge of the rest of the pattern. Similarly, if the defect compensation is performed in hardware, the processing may be distributed among multiple hardware components acting in parallel.

Pixel-Based Corner Enhancement

Figure 1:
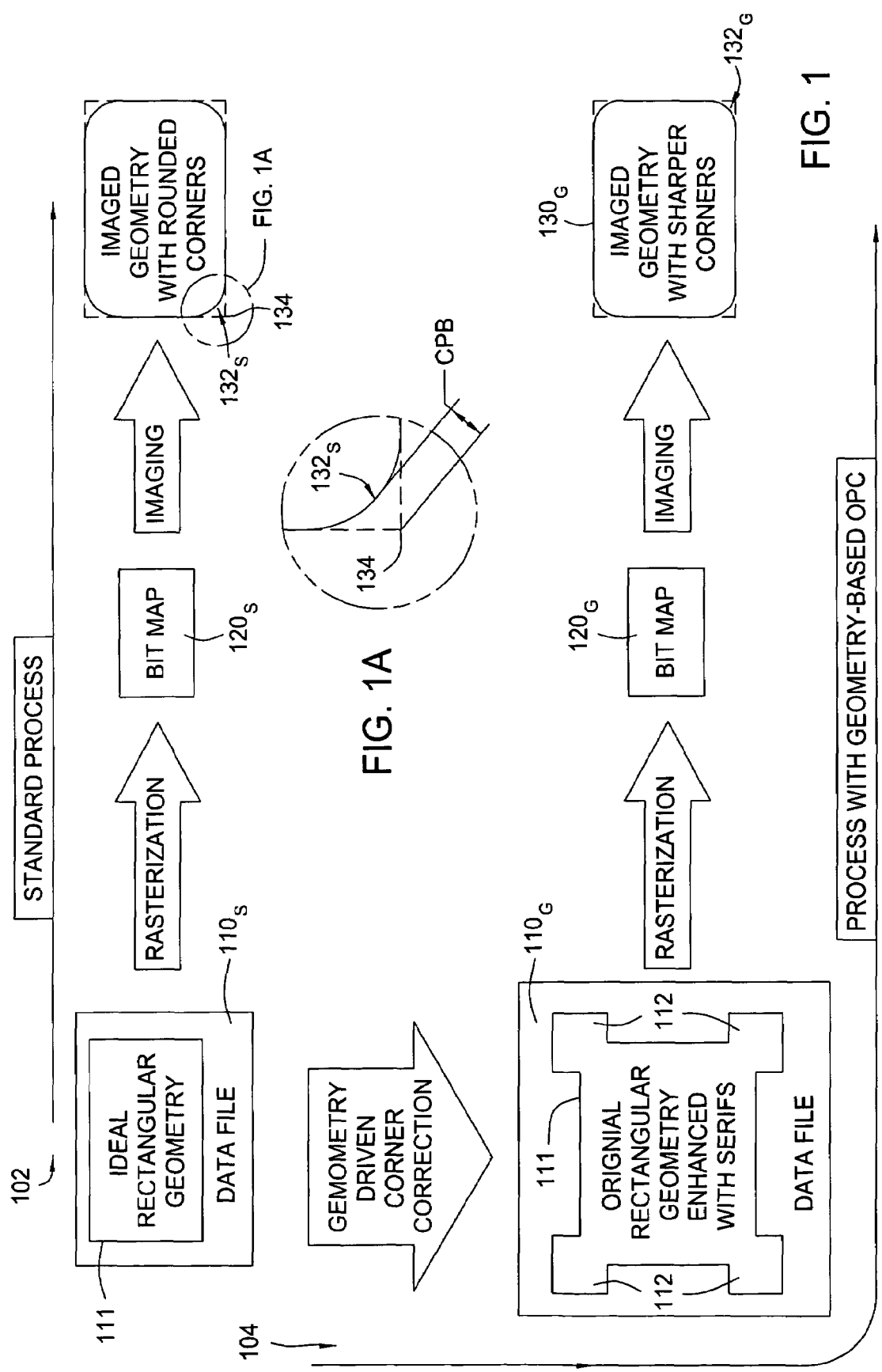
FIG. 1 illustrates a process for geometric-based optical proximity correction in accordance with the prior art.
Figure 2:
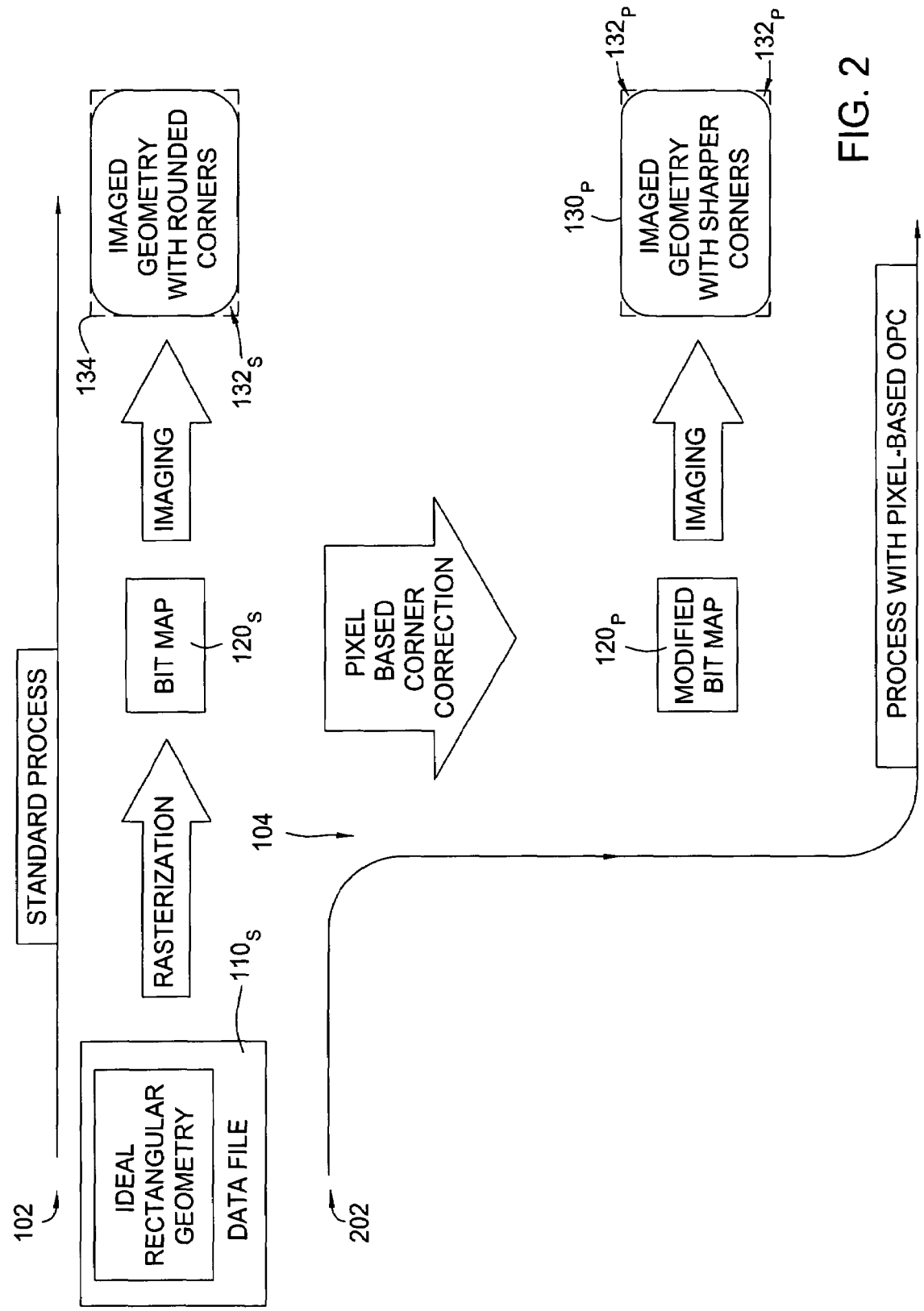
FIG. 2 illustrates a process for pixel-based optical proximity correction in accordance with embodiments of the present invention.

FIG. 2 illustrates a process flow 202 including "pixel based" optical proximity correction (OPC) for writing a pattern 111 via lithography. As illustrated, a data file 110$_S$ may be converted to a bit map 120$_S$ by a rasterization process, as in the standard flow 102. However, rather than using this standard bit map 120$_S$ to write the pattern 111, which may result in rounded corners 132$_S$, an enhanced bit map 120$_P$ is used. The enhanced bit map 120$_P$ is generated by manipulating grayscale values of pixels in the standard bit map 120$_S$. The grayscale values may be manipulated, using various techniques described herein, in an effort to modify the doses of energy provided at or in proximity to corner pixels when writing the pattern, in an effort to achieve corners 132$_P$ more closely approximating the ideal corners of the pattern 111.

Figure 3:
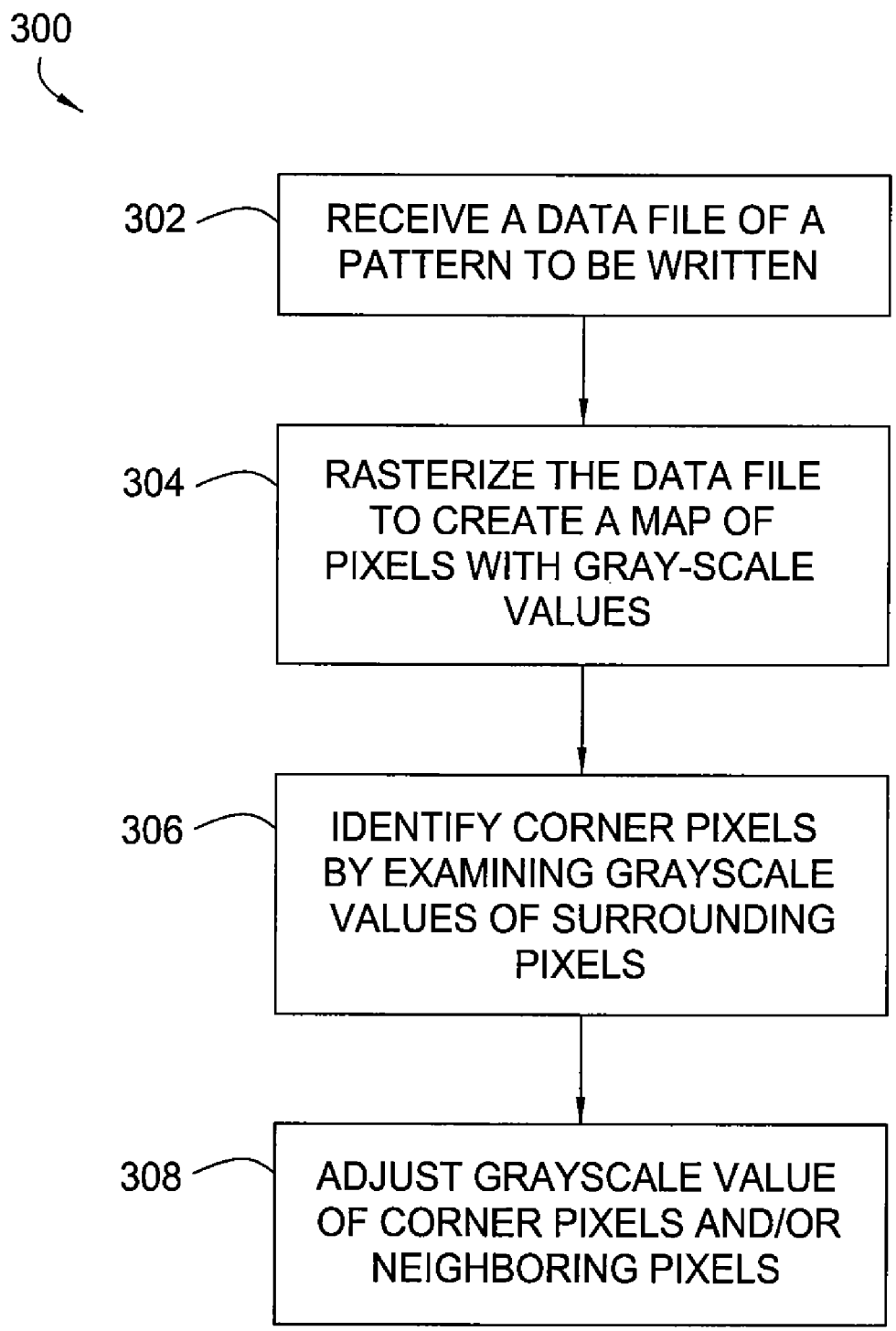
FIG. 3 is a flow diagram of exemplary operations for pixel-based optical proximity correction in accordance with embodiments of the present invention.

FIG. 3 illustrates exemplary operations 300 that may be performed as part of the process flow 202. The operations 300 begin, at step 302, by receiving the data file of a pattern to be written. The data file may be in any suitable file format representing the geometric features of the pattern, such as the graphic design system (GDS) or MEBES formats. At step 304, the data file is rasterized to create a map of pixels with grayscale values. For some embodiments, pixels may be composed of an array of sub-pixels and the rasterization process may involve determining how many of a limited number of sample sub-pixels (or subsamples) the pattern covers. Setting the grayscale value for each pixel may then essentially involve counting all of the covered subsamples as described in the previously referenced U.S. Pat. No. 5,533,170. In other words, in general, the greater the area of a pixel covered by the pattern, the higher the grayscale value will be.

At step 306, pixels on which corners of the pattern overlay (hereinafter, "corner pixels") are identified. At step 308, the grayscale values of the identified corner pixels and/or neighboring pixels are adjusted. While detecting and correcting these corner pixels are the basic steps involved in pixel-based correction of rounded corners, a number of different approaches may be taken to accomplish each. As will be described throughout, deciding the exact approach to take for each may involve a variety of considerations, including tradeoffs between cost and performance.

Figure 4A:
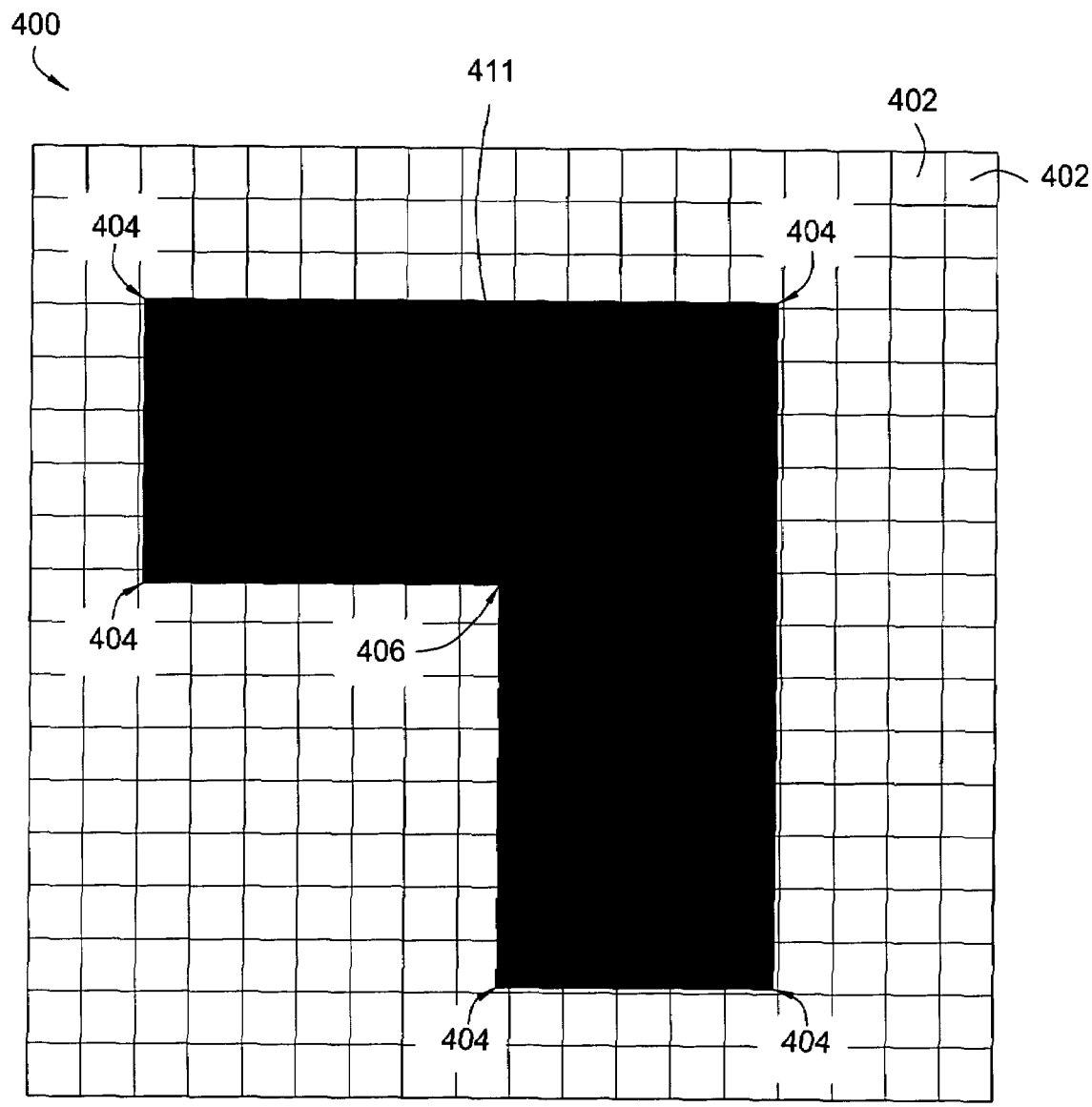

The challenge of detecting corner pixels may be demonstrated with reference to FIG. 4A, which illustrates an exemplary pattern 411 overlaying a grid 400 of pixels 402. As illustrated, the pattern 411 has five convex (outer) corners 404 and one concave (inner) corner 406. While the pixels containing these corners may be readily discernable to a viewer, what is needed is an algorithm that can be implemented in hardware and/or software that is capable of reliably detecting these corner pixels. One such algorithm detects corner pixels by examining grayscale values of pixels neighboring the corner pixels.

As previously described, the grayscale value of each pixel 402 may be indicative of what percentage of the pixel is covered by the pattern 411. This is illustrated in FIG. 4B, which shows a map 450 of grayscale values corresponding to the pattern 411 shown in FIG. 4A. For purposes of illustration, grayscale values ranging from 0-16 are used, with the assumption that higher grayscale values correspond to greater pixel coverage, such that the minimum grayscale value (0) represents white while the maximum grayscale value (16) represents black. Accordingly, pixels with no portion covered by the pattern 411 are zero, pixels completely covered by the pattern 411 are 16, while pixels partially covered are some intermediate value, somewhat proportional to the amount of coverage.

Corner Detection Based on Zero Grayscale Neighbors

Figure 5:
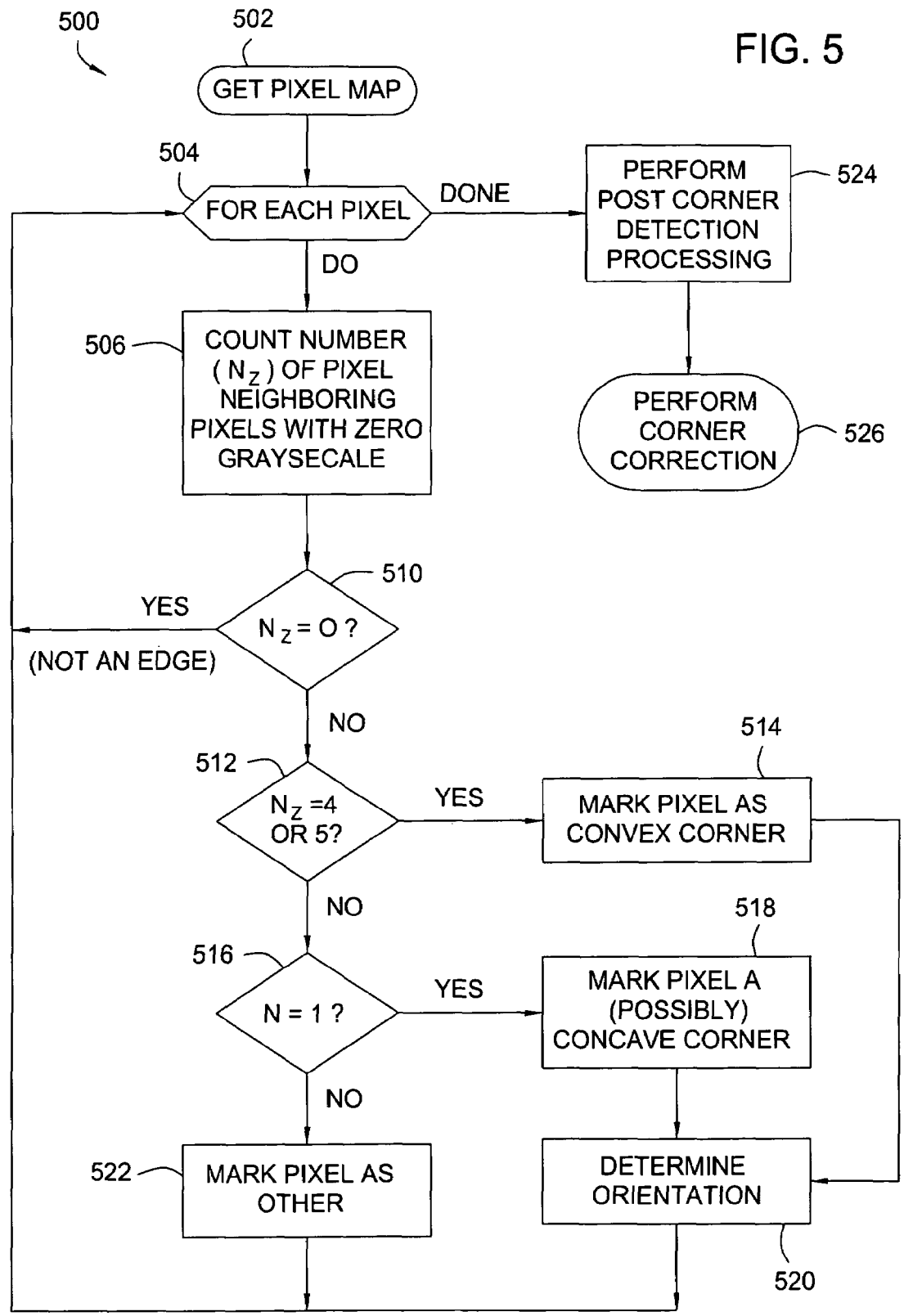
FIG. 5 is a flow diagram of exemplary operations for detecting corners in accordance with embodiments of the present invention.

FIG. 5 illustrates exemplary operations 500 for detecting corner pixels by examining grayscale values of pixels surrounding the corner pixels. For different embodiments, the operations 500 may be performed in software, hardware, or a combination thereof. For example, for some embodiments, the pixel map may be transferred from a rasterizing engine to one or more general purpose processors, each executing a program to perform the detection. For other embodiments, hardware components, such as application specific integrated circuits (ASICs) or field programmable gate arrays (FPGAs) may perform the detection.

In any case, the operations 500 begin, at step 502, by receiving a pixel map 502. At step 504, a loop of operations 506-522 is entered, to be performed on each pixel. In other words, each pixel is examined to determine if it is a corner pixel and, if so, what type, by examining the number of neighboring pixels having a zero grayscale value.

As illustrated in FIG. 4B, each corner pixel has at least one neighboring pixel with a zero grayscale value. This follows from the fact that a corner lies on an intersection between two edges. As each edge is a transition from black to white, each edge pixel may be identified either as a pixel having a "gray value" between black and white, and/or (even if the edge is aligned with the pixel grid and, thus has a maximum grayscale value) must have at least one zero grayscale value neighboring pixel. Further, each different type of corner pixel (convex and concave) may have a different number of zero grayscale neighbors. Thus, the number of zero grayscale neighbors may be useful in detecting the presence of pixel corners, classifying them (as convex or concave), and determining their orientation.

Accordingly, at step 506, the number ($N_Z$) of neighboring pixels (of a pixel being examined) with zero grayscale is counted. For example, as illustrated in FIG. 4B, a 3×3 array 452 of pixels may be assembled, with a pixel 454 under examination in the center. The outer pixels of the array 452 having zero grayscale may then be counted.

As previously described, each corner pixel must lie on an edge and each edge pixel must have at least one zero grayscale neighbor. Accordingly, pixels having no zero grayscale neighbors, as determined at step 510, are not edge or corner pixels and, therefore, further processing is not required. In typical patterns, only a small percentage of pixels (e.g., approximately 10%) may be edges. Thus, quickly testing to determine a pixel is not an edge pixel and, thus not a corner pixel, may prevent unnecessary subsequent processing of non-edge pixels.

As illustrated in FIG. 4B, convex corner pixels 454 may have five zero grayscale neighbors. While not shown, some convex corner pixels may have only four zero grayscale neighbors, for example, if a small feature of a pattern, offset from the corner by one pixel, extends outwardly one pixel away from the corner. Accordingly, if a pixel has four or five grayscale neighbors, as determined at step 512, that pixel may be marked as a convex corner, at step 514.

Concave corner pixels 456, on the other hand, have only one zero grayscale neighbor (located on a diagonal). Accordingly, if a pixel has only one grayscale neighbor, as determined at step 516, that pixel may be marked as a concave corner, at step 518. In some cases, undersampling errors may result in a zero grayscale value for a pixel even though the pattern actually impinges on the pixel. In such cases, a pixel may be mismarked as a concave corner due to the erroneous zero grayscale. Further, in some cases, a vertex of a trapezoidal jog may also have a single zero grayscale neighbor. As a result, the marking in step 518 may actually indicate the pixel is "possibly" a concave corner and further processing (e.g., performed as part of post-corner detection processing, at step 524) may be required to resolve whether the pixel is, in fact, a concave corner. For some embodiments, undersampled pixels may be detected during rasterization (e.g., prior to receiving a pixel map, at step 502) and corrective measures may be taken to avoid sub-sampled errors, such as setting a single sub-sample bit.

Once pixels are identified as corner pixels, whether concave or convex, their orientation (e.g., Upper Left, Upper Right, Lower Left, or Lower Right) may be determined, at step 520. Any suitable technique may be utilized to determine the orientation of the corners. For example, the orientation of concave corners may be determined by identifying the location of the single zero grayscale diagonal neighbor. Similarly, the orientation of convex corner pixels may be determined by identifying the location of a single non-zero grayscale diagonal neighbor.

Pixels having some number of zero grayscale neighbors (other than 0, 1, 4, or 5) may represent some other type of feature. For example, a jog or neck may have two or three zero grayscale neighbors, a one pixel-wide line may have six or seven zero grayscale neighbors, while an isolated pixel may have eight zero grayscale neighbors. Such pixels may be marked accordingly, at step 522.

For some embodiments, once each pixel has been examined, post-corner detection processing may be performed, at step 524. Post-corner processing may include various operations, such as resolving undersampling errors (which may also be done during rasterization), resolving adjacent corners, and detecting trapezoidal jogs. For example, undersampling errors may be resolved by additional processing to determine if any portion of a pattern overlays a zero grayscale pixel without impinging on a subsampled pixel. Resolving adjacent corners may involve examining pixels adjacent to (or in proximity to) an identified corner, in an effort to ensure the addition of dose during subsequent convex corner correction does not result in bridging between adjacent features or that removal of dose during subsequent concave corner correction does not result in loss of continuity.

For some embodiments, external information, such as data from the original pattern data file, may be used to assist in this post-corner processing. Such external information may provide precise information regarding the pattern relative to the pixel grid, not readily available from the grayscale pixel map, such as precise locations of a pattern to resolve undersampling errors.

Corner Correction

Figure 6:
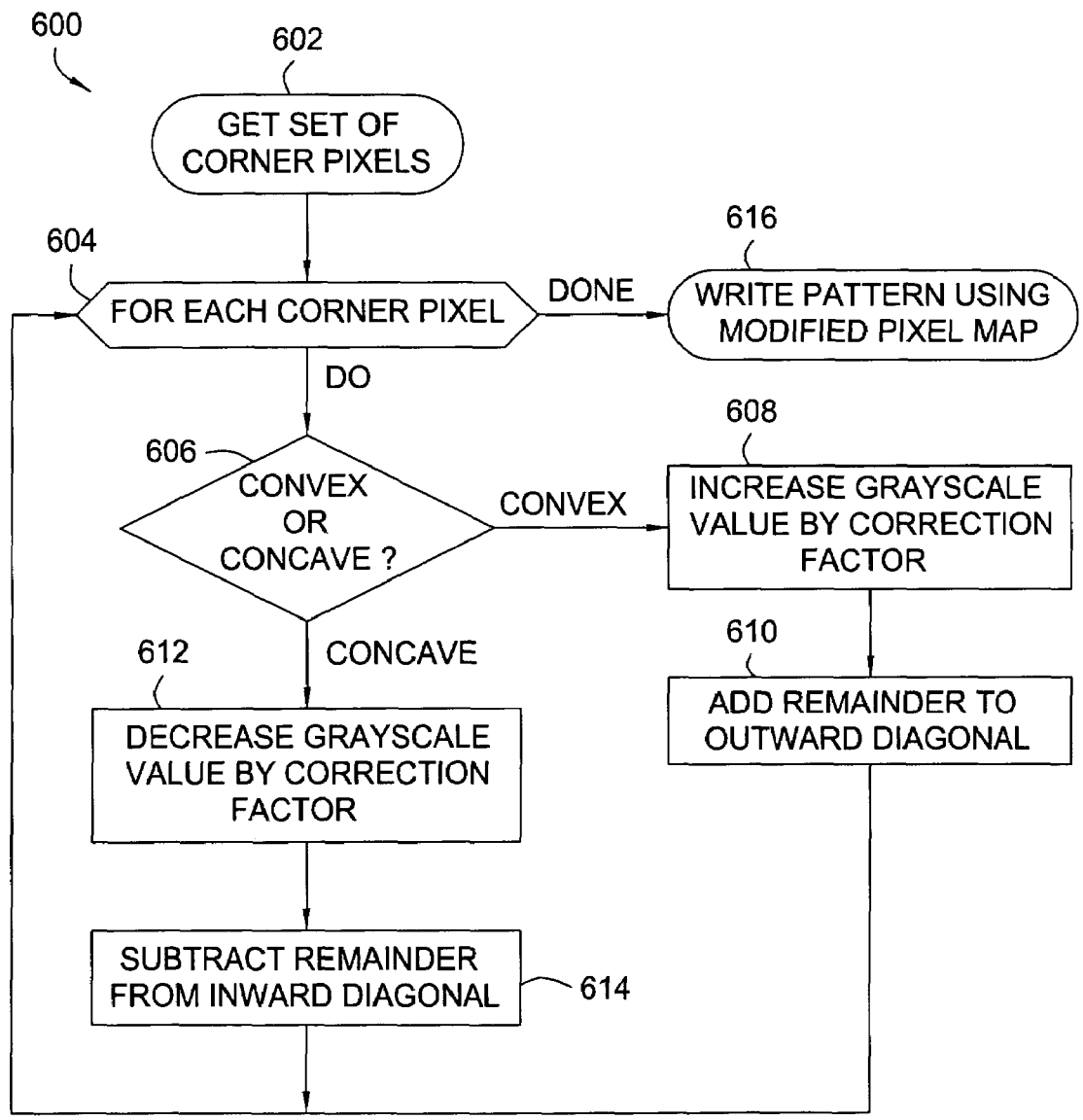
FIG. 6 is a flow diagram of exemplary operations for correcting corners in accordance with embodiments of the present invention.

After post-corner detection processing, corner correction may be performed, at step 526. FIG. 6 illustrates exemplary operations 600 for correcting corners. The operations 600 begin, at step 602, by receiving a set of pixels identified as corner pixels. At step 604, a loop of operations 608-614 to be performed on each corner pixel is entered. As previously described, corner correction may involve manipulating grayscale values of corner pixels and/or neighboring pixels in an effort to add dose to "stretch" convex corners (or remove dose to "shrink" concave corners) to more closely match the ideal corners of the pattern being written.

Thus, if a corner pixel is a convex pixel, as determined at step 606, the grayscale value of the corner pixel is increased by a correction factor, at step 608. In some cases, the correction factor may be adjustable, for example, by a user via a graphical user interface (GUI), and the exact value chosen may be based, for example, by the amount of correction needed, as determined from previous trials of writing the same pattern. For some embodiments, separate correction factors may be used to correct convex and concave corners and each may be independently adjustable by a user. More complex schemes involving multiple correction factors, for adjusting the grayscale value of multiple neighboring pixels are also possible. In either case, in some instances, the sum of the original grayscale value and the correction factor may exceed the maximum pixel value. As it is not possible to add more dose to the corner pixel, the remainder may be added to the neighboring pixel diagonally outward, at step 610.

On the other hand, if a corner pixel is a concave pixel, the grayscale value of the corner pixel is decreased by the correction factor, at step 612. If the correction factor is greater than the original grayscale value, the grayscale value of the corner pixel will be set to zero. To ensure the desired amount of dose is removed to correct the concave corner, the remainder may then be subtracted from the neighboring pixel diagonally inward, at step 614.

For some embodiments, the horizontal and vertical (i.e., X and Y) dimensions of a pixel may not be symmetrical. For example, the Y dimension may be greater than the X dimension, resulting in pixels that are taller than they are wide. Therefore, diagonal neighboring pixels may not be located on an exactly 45 degree line, but rather, on a different angle determined by the pixel dimensions. Accordingly, in such cases, in order to increase dose diagonally outward or decrease dose diagonally inward, the grayscale value of more than one pixel may need to be adjusted (e.g., ratiometrically, based on the X and Y dimensions). Further, in some cases, non-cartesian pixel grids, such as hexagonal grids may be utilized. In such cases, the addition or subtraction of dose may be propagated accordingly.

FIG. 7 illustrates an exemplary map 750 of "corrected" grayscale values generated by performing the operations 600 on the original grayscale values shown in FIG. 4B. For illustrative purposes, it is assumed the correction factor is 10, that a single correction factor is applied to correct both concave and convex corners, and that the grayscale values range from 0 to 16. Beginning with the upper convex corners, the original grayscale values of these corner pixels was 2. Accordingly, adding the correction factor of 10 to these corner pixels yields a corrected pixel value of 12. Similarly, adding the correction factor of 10 to the original grayscale value of the lower left convex corner pixels yields corrected pixel values of 14.

The sum of the correction factor of 10 and the grayscale value of the lower right convex corner pixel, on the other hand, is greater than the maximum grayscale value of 16. Accordingly, this corner pixel is set to the maximum value of 16 and the remainder of 6 is propagated to the neighboring pixel diagonally outward. In a similar manner, as the grayscale value of the (lower) concave corner pixel value (6) is less than the correction factor (10), its corrected grayscale value is set to zero, while the remainder (4) is subtracted from the neighboring pixel diagonally inward, resulting in a corrected grayscale value of 12 for this pixel.

As illustrated in FIG. 8A, the effect of increasing the grayscale values at and near the convex corners is that the corrected convex corner $832_P$ is stretched out relative to, and approaches the sharp edges of the ideal pattern more closely than the uncorrected convex corner $832_S$. With similar effect, as illustrated in FIG. 8B, decreasing the grayscale values at and near the concave corners pulls back the corrected concave corner $834_P$ relative to the uncorrected convex corner $834_S$.

CONCLUSION

By manipulating the grayscale values of pixels (post-rasterization), the amount of radiation dose at or near pixel corners may be increased or decreased to compensate for boundary effects. As a result, the actual corners of a pattern being written may more closely resemble the ideal corners of the pattern without increasing the size of the data file representing the pattern or data transfer times.

While the foregoing is directed to embodiments of the present invention, other and further embodiments of the invention may be devised without departing from the basic scope thereof, and the scope thereof is determined by the claims that follow.

What is claimed is:

1. A method for adjusting corners of a pattern to be written into a sensitive recording surface, comprising:

generating a pixel map by rasterizing a data file for an image of the pattern, the pixel map comprising an array of pixels having corresponding grayscale values;

detecting corner pixels in the pixel map by examining grayscale values of pixels surrounding the corner pixels, wherein corners of the pattern impinge on the corner pixels; and adjusting grayscale values of at least one of corner pixels and pixels neighboring corner pixels, wherein detecting corner pixels comprises counting a number of pixels surrounding a potential corner pixel that have zero grayscale values and determining a potential corner pixel is a convex corner pixel if the number of pixels surrounding the potential corner pixel that have zero grayscale values is four or five.

2. A method for adjusting corners of a pattern to be written into a sensitive recording surface, comprising:

generating a pixel map by rasterizing a data file for an image of the pattern, the pixel map comprising an array of pixels having corresponding grayscale values;

detecting corner pixels in the pixel map by examining grayscale values of pixels surrounding the corner pixels, wherein corners of the pattern impinge on the corner pixels; and adjusting grayscale values of at least one of corner pixels and pixels neighboring corner pixels, wherein detecting corner pixels comprises counting a number of pixels surrounding a potential corner pixel that have zero grayscale values and determining a potential corner pixel is a concave corner pixel if the number of pixels surrounding the potential corner pixel that have zero grayscale values is one.

3. A The method for adjusting corners of a pattern to be written into a sensitive recording surface, comprising:

generating a pixel map by rasterizing a data file for an image of the pattern, the pixel map comprising an array of pixels having corresponding grayscale values;

detecting corner pixels in the pixel map by examining grayscale values of pixels surrounding the corner pixels, wherein corners of the pattern impinge on the corner pixels; and adjusting grayscale values of at least one of corner pixels and pixels neighboring corner pixels, wherein adjusting grayscale values of at least one of corner pixels and pixels neighboring corner pixels comprises:

calculating a sum of a grayscale value of a convex corner pixel and a correction factor; and increasing the grayscale value of the convex corner pixel by the correction factor if the calculated sum is less than or equal to a maximum grayscale value.

4. The method of claim 3, wherein adjusting grayscale values of at least one of corner pixels and pixels neighboring corner pixels further comprises:

increasing the grayscale value of one or more pixels neighboring the convex corner pixel if the calculated sum exceeds the maximum grayscale value.

5. The method of claim 4, wherein increasing the grayscale value of one or more pixels neighboring the convex corner pixel if the calculated sum is greater than the maximum grayscale value comprises increasing the grayscale value of one or more pixels diagonally outward from the convex corner pixel by the amount the calculated sum exceeds the maximum grayscale value.

6. The method of claim 3, wherein the correction value is adjustable.

7. A method for adjusting corners of a pattern to be written into a sensitive recording surface, comprising:

generating a pixel map by rasterizing a data file for an image of the pattern, the pixel map comprising an array of pixels having corresponding grayscale values;

detecting corner pixels in the pixel map by examining grayscale values of pixels surrounding the corner pixels, wherein corners of the pattern impinge on the corner pixels; and adjusting grayscale values of at least one of corner pixels and pixels neighboring corner pixels, wherein adjusting grayscale values of at least one of corner pixels and pixels neighboring corner pixels comprises:

calculating a difference value by subtracting a correction factor from a grayscale value of a concave corner pixel; and decreasing the grayscale value of the concave corner pixel by the correction factor if the calculated difference is less than or equal to a minimum grayscale value.

8. The method of claim 7, wherein adjusting grayscale values of at least one of corner pixels and pixels neighboring corner pixels further comprises: decreasing the grayscale value of one or more pixels neighboring the concave corner pixel if the calculated difference is less than the minimum grayscale value.

9. A method for adjusting corners of a pattern to be written into a sensitive recording surface, comprising:

generating a pixel map by rasterizing a data file for an image of the pattern, the pixel map comprising an array of pixels having corresponding grayscale values;

detecting convex and concave corner pixels in the pixel map by examining grayscale values of pixels surrounding the corner pixels;

increasing grayscale values of at least one of convex corner pixels and pixels neighboring convex corner pixels; and decreasing grayscale values of at least one of concave corner pixels and pixels neighboring concave corner pixels, wherein increasing grayscale values of at least one of convex corner pixels and pixels neighboring convex corner pixels comprises:

calculating a sum of a grayscale value of a convex corner pixel and a first correction factor; and increasing the grayscale value of the convex corner pixel by the first correction factor if the calculated sum is less than or equal to a maximum grayscale value.

10. The method of claim 9, wherein increasing grayscale values of at least one of convex corner pixels and pixels neighboring convex corner pixels further comprises:

increasing the grayscale value of one or more pixels neighboring the convex corner pixel if the calculated sum exceeds the maximum grayscale value.

11. The method of claim 10, wherein increasing the grayscale value of one or more pixels neighboring the convex corner pixel if the calculated sum is greater than the maximum grayscale value comprises increasing the grayscale value of a pixel diagonally outward from the convex corner pixel by the amount the calculated sum exceeds the maximum grayscale value.

12. The method of claim 9, wherein decreasing grayscale values of at least one of concave corner pixels and pixels neighboring concave corner pixels comprises:

calculating a difference value by subtracting a second correction factor from a grayscale value of a concave corner pixel; and decreasing the grayscale value of the concave corner pixel by the second correction factor if the calculated difference is less than or equal to a minimum grayscale value.

13. The method of claim 12, wherein decreasing grayscale values of at least one of concave corner pixels and pixels neighboring concave corner pixels further comprises:

decreasing the grayscale value of one or more pixels neighboring the concave corner pixel if the calculated difference is less than the minimum grayscale value.

14. The method of claim 12, wherein the first and second correction values are independently adjustable.

15. A method for adjusting corners of a pattern to be written into a sensitive recording surface, comprising:

generating a pixel map by rasterizing a data file for an image of the pattern, the pixel map comprising an array of pixels having corresponding grayscale values;

detecting convex and concave corner pixels in the pixel map by examining grayscale values of pixels surrounding the corner pixels;

increasing grayscale values of at least one of convex corner pixels and pixels neighboring convex corner pixels; and decreasing grayscale values of at least one of concave corner pixels and pixels neighboring concave corner pixels, further comprising:

prior to the increasing or decreasing, determining if one or more of the detected convex or concave corner pixels lie on trapezoidal vertices; and only increasing or decreasing grayscale values of convex and concave corner pixels that do not lie on trapezoidal vertices.

16. A system for writing a pattern in a resistive surface, comprising:

a rasterizer configured to generate a pixel map from a data file for an image of the pattern, the pixel map comprising an array of pixels having corresponding grayscale values;

a corner detection unit configured to detect corner pixels in the pixel map by examining grayscale values of pixels surrounding the corner pixels, wherein corners of the pattern impinge on the corner pixels; and a corner correction unit configured to adjust grayscale values of at least one of corner pixels and pixels neighboring corner pixels, wherein the corner correction unit is configured to increase grayscale values of at least one of convex corner pixels and pixels neighboring convex corner pixels, decrease grayscale values of at least one of concave corner pixels and pixels neighboring concave corner pixels, and wherein the corner correction unit is further configured to: calculate a sum of a grayscale value of a convex corner pixel and a first correction factor, increase the grayscale value of the convex corner pixel by the first correction factor if the calculated sum is less than or equal to a maximum grayscale value, and increase the grayscale value of one or more pixels neighboring the convex corner pixel if the calculated sum exceeds the maximum grayscale value.

17. The system of claim 16, wherein the corner correction unit is configured to increase the grayscale value of one or more pixels neighboring the convex corner pixel if the calculated sum exceeds the maximum grayscale value.

18. The system of claim 17, wherein the corner correction unit is configured to increase the grayscale value of a pixel diagonally outward from the convex corner pixel by an amount the calculated sum exceeds the maximum grayscale value.

* * * * *

UNITED STATES PATENT AND TRADEMARK OFFICE
CERTIFICATE OF CORRECTION

PATENT NO. : 7,420,710 B2 Page 1 of 1
APPLICATION NO. : 10/870597
DATED : September 2, 2008
INVENTOR(S) : Klatchko et al.

It is certified that error appears in the above-identified patent and that said Letters Patent is hereby corrected as shown below:

Column 2, Line 66, please delete "Corners" and insert --corners-- therefor;

Column 9, Claim 3, Line 13, please delete "The".

Signed and Sealed this

Sixth Day of January, 2009

JON W. DUDAS
*Director of the United States Patent and Trademark Office*